United States Patent
Kuroda

(10) Patent No.: US 11,069,823 B2
(45) Date of Patent: Jul. 20, 2021

(54) PHOTOELECTRIC CONVERSION DEVICE, PHOTOELECTRIC CONVERSION SYSTEM, AND MOVABLE OBJECT COMPRISING A COMPARISON UNIT TO COMPARE THE COUNT VALUE OF PULSE WITH A PREDETERMINED THRESHOLD VALUE

(71) Applicant: CANON KABUSHIKI KAISHA, Tokyo (JP)

(72) Inventor: Yukihiro Kuroda, Inagi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 292 days.

(21) Appl. No.: 16/359,392

(22) Filed: Mar. 20, 2019

(65) Prior Publication Data
US 2019/0305146 A1    Oct. 3, 2019

(30) Foreign Application Priority Data
Apr. 2, 2018    (JP) .............................. JP2018-070867

(51) Int. Cl.
| | | |
|---|---|---|
| H01L 27/146 | (2006.01) | |
| H01L 31/02 | (2006.01) | |
| H01L 27/144 | (2006.01) | |
| G01S 7/4861 | (2020.01) | |
| H01L 31/107 | (2006.01) | |

(52) U.S. Cl.
CPC ...... H01L 31/02027 (2013.01); G01S 7/4861 (2013.01); H01L 27/144 (2013.01); H01L 31/107 (2013.01)

(58) Field of Classification Search
CPC ................. G01S 7/4861; H01L 27/144; H01L 27/14634; H01L 31/02027; H01L 31/107
USPC ........................................... 250/214 R, 208.1
See application file for complete search history.

(56) References Cited

U.S. PATENT DOCUMENTS

| | | | |
|---|---|---|---|
| 7,709,869 B2 | 5/2010 | Kuroda | |
| 7,911,521 B2 | 3/2011 | Kuroda | |
| 7,935,995 B2 | 5/2011 | Watanabe | |
| 8,174,599 B2 | 5/2012 | Kuroda | |

(Continued)

FOREIGN PATENT DOCUMENTS

| | | |
|---|---|---|
| JP | 2014-81253 | 5/2014 |

OTHER PUBLICATIONS

U.S. Appl. No. 16/254,779, filed Jan. 23, 2019, by Tatsuhito Golden, et. al.

*Primary Examiner* — Que Tan Le
(74) *Attorney, Agent, or Firm* — Venable LLP

(57) ABSTRACT

A photoelectric conversion device includes a plurality of pixels arranged in a plurality of rows and a plurality of columns, and a plurality of output lines to which signals from the plurality of pixels are output, and each of the plurality of pixels includes a light receiving unit that outputs a pulse in response to incidence of a photon and a signal generation unit that, based on output from the light receiving unit, generates a pixel signal output to each of the output lines. The signal generation unit includes a count unit that generates a count signal indicating a count value of pulses output from the light receiving unit and a comparison unit that compares the count value indicated by the count signal with a predetermined threshold value, and the signal generation unit outputs a signal in accordance with a result of comparison performed by the comparison unit.

9 Claims, 11 Drawing Sheets

(56) References Cited

U.S. PATENT DOCUMENTS

| | | |
|---|---|---|
| 8,222,682 B2 | 7/2012 | Watanabe |
| 8,223,238 B2 | 7/2012 | Kuroda |
| 8,345,137 B2 | 1/2013 | Shinohara |
| 8,390,713 B2 | 3/2013 | Kuroda |
| 8,670,058 B2 | 3/2014 | Hayashi |
| 8,710,558 B2 | 4/2014 | Inoue |
| 8,994,862 B2 | 3/2015 | Kuroda |
| 9,236,406 B2 | 1/2016 | Kuroda |
| 9,305,954 B2 | 4/2016 | Kato |
| 9,357,122 B2 | 5/2016 | Kususaki |
| 9,445,023 B2 | 9/2016 | Kuroda |
| 9,762,837 B2 | 9/2017 | Kuroda |
| 10,007,006 B2 * | 6/2018 | Nishihara ............ H04N 5/3575 |
| 10,021,316 B2 | 7/2018 | Kuroda |
| 2012/0175503 A1 | 7/2012 | Kuroda |
| 2017/0318253 A1 | 11/2017 | Kuroda |
| 2018/0316884 A1 | 11/2018 | Kuroda |

* cited by examiner

PHOTOELECTRIC CONVERSION DEVICE, PHOTOELECTRIC CONVERSION SYSTEM, AND MOVABLE OBJECT COMPRISING A COMPARISON UNIT TO COMPARE THE COUNT VALUE OF PULSE WITH A PREDETERMINED THRESHOLD VALUE

BACKGROUND OF THE INVENTION

Field of the Invention

The present invention relates to a photoelectric conversion device, a photoelectric conversion system, and a movable object.

Description of the Related Art

A photoelectric conversion device that digitally counts the number of photons arriving at a light receiving unit and outputs the count value from a pixel as a digital signal is known. Japanese Patent Application Laid-Open No. 2014-081253 discloses a photodetector having a light receiving unit that includes a photon-count type light receiving element that outputs binary pulses indicating the presence or absence of photon incidence and an accumulation unit that calculates an output value resulted by integrating or accumulating the total value of the pulse widths of pulses output from the light receiving unit. Japanese Patent Application Laid-Open No. 2014-081253 further discloses a correction unit that performs correction on the output value from the accumulation unit.

However, the correction unit disclosed in Japanese Patent Application Laid-Open No. 2014-081253 is to perform a correction process so that the output value becomes a value proportional to an incident light amount and does not perform correction on each of a plurality of pixels. In particular, in Japanese Patent Application Laid-Open No. 2014-081253, there is no consideration on detection of a defective pixel or correction of the output thereof.

SUMMARY OF THE INVENTION

The present invention intends to provide a photon-count type photoelectric conversion device that can detect a defective pixel or correction of an output value from the defective pixel.

According to one aspect of the present invention, provided is a photoelectric conversion device including a plurality of pixels arranged in a plurality of rows and a plurality of columns and a plurality of output lines to which signals from the plurality of pixels are output, wherein each of the plurality of pixels includes a light receiving unit that outputs a pulse in response to incidence of a photon and a signal generation unit that, based on output from the light receiving unit, generates a pixel signal output to corresponding output line, wherein the signal generation unit includes a count unit that generates a count signal indicating a count value of pulses output from the light receiving unit and a comparison unit that compares the count value indicated by the count signal with a predetermined threshold value, and wherein signal generation unit outputs a signal in accordance with a result of comparison performed by the comparison unit.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

First Embodiment

Figure 1:
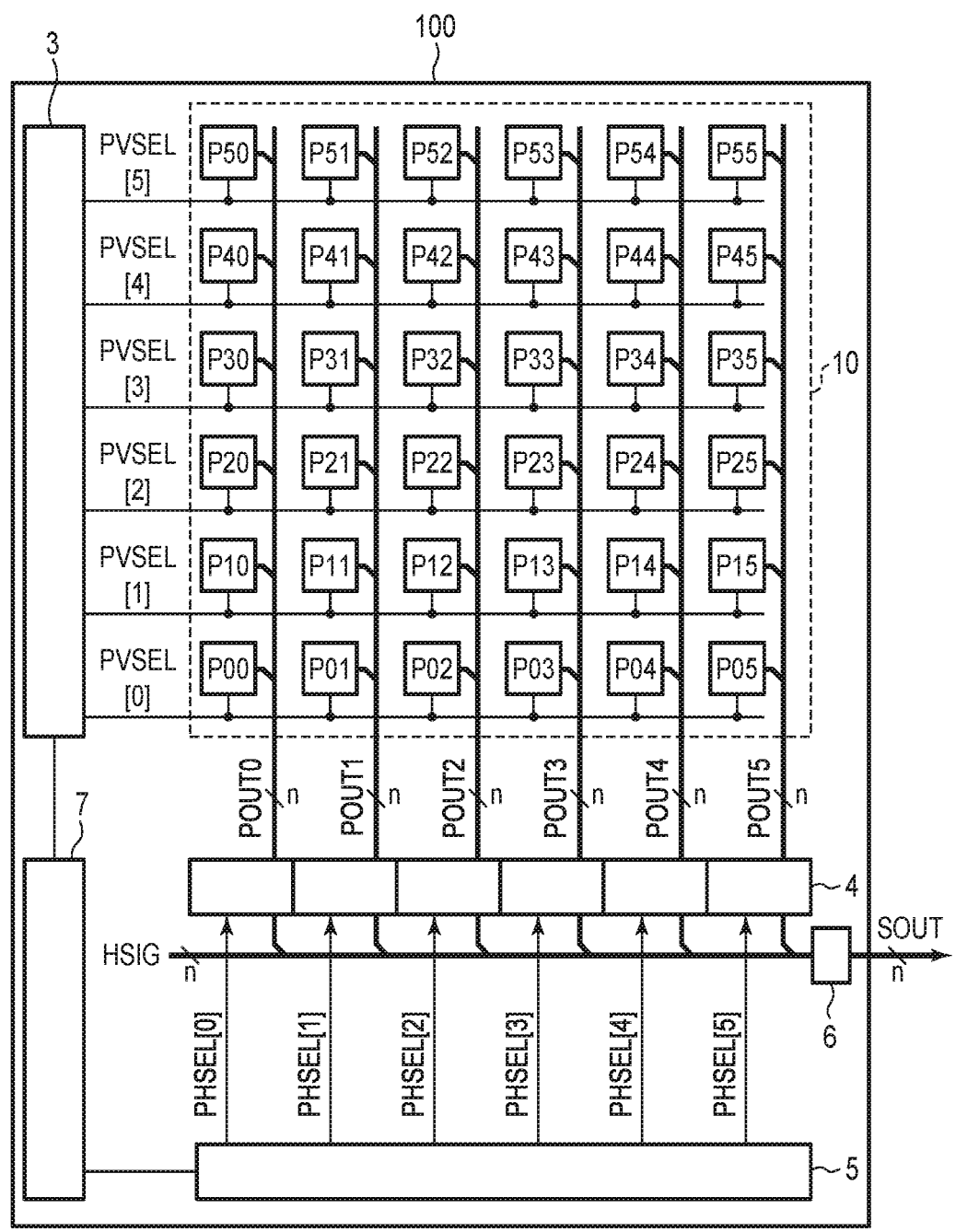
FIG. 1 is a block diagram illustrating a general configuration of a photoelectric conversion device according to a first embodiment of the present invention.
Figure 2:
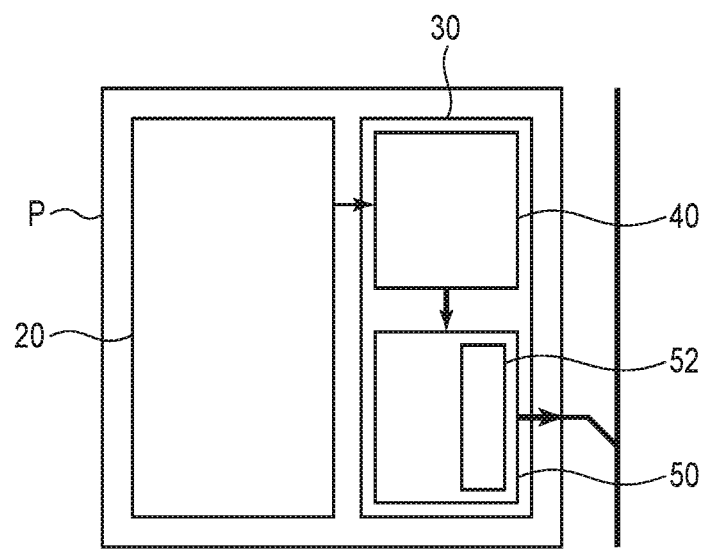
FIG. 2 is a diagram illustrating a general configuration of a pixel of the photoelectric conversion device according to the first embodiment of the present invention.
Figure 3:
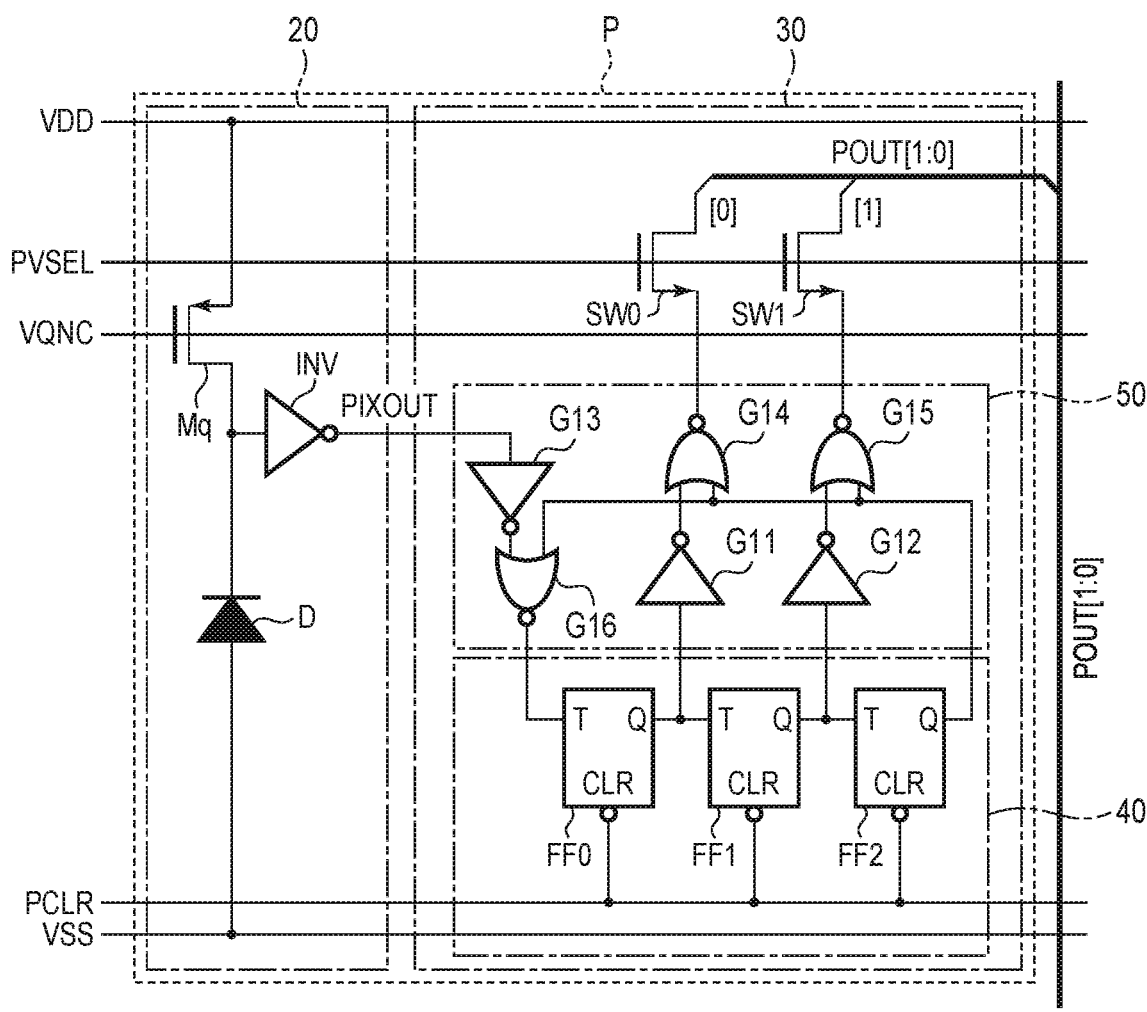
FIG. 3 is a circuit diagram illustrating a configuration example of the pixel of the photoelectric conversion device according to the first embodiment of the present invention.
Figure 4:
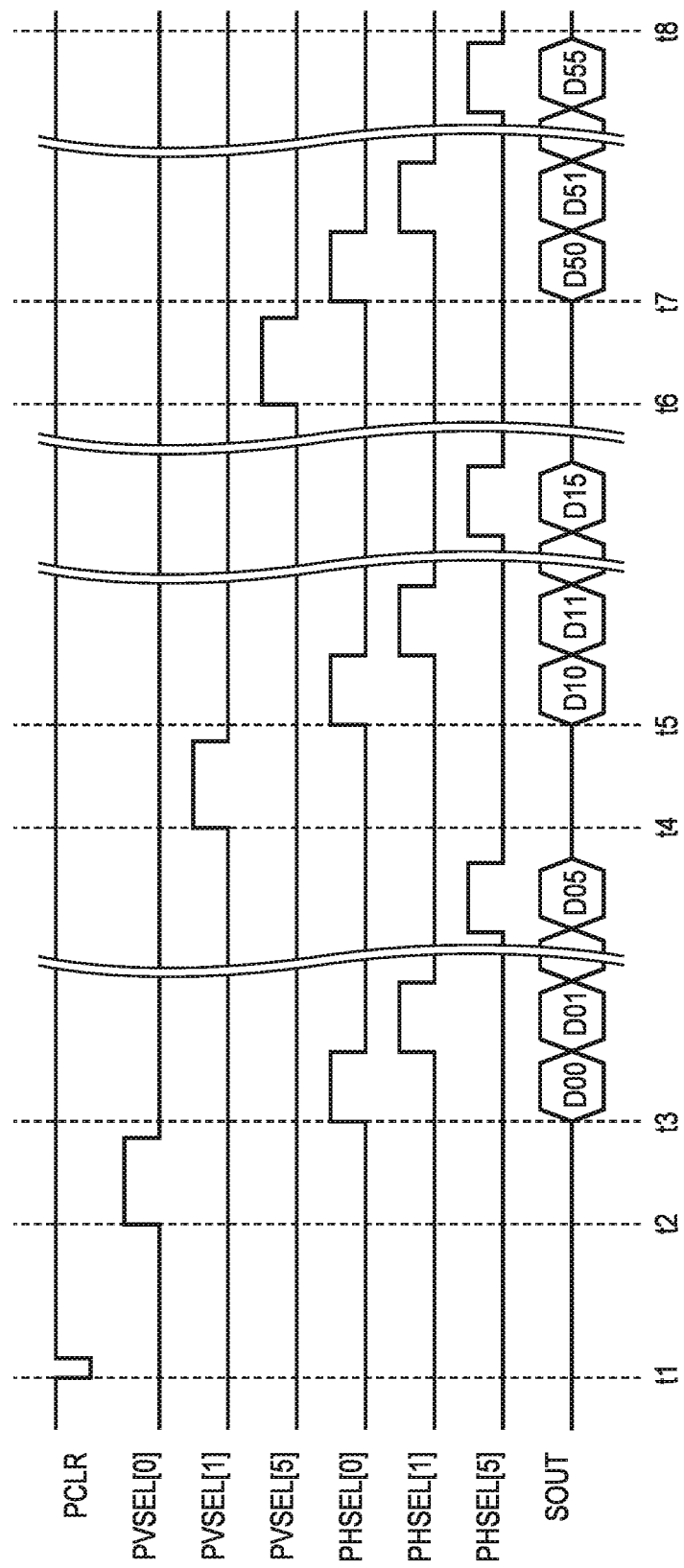
FIG. 4 is a timing chart illustrating a method of driving the photoelectric conversion device according to the first embodiment of the present invention.
Figure 5:
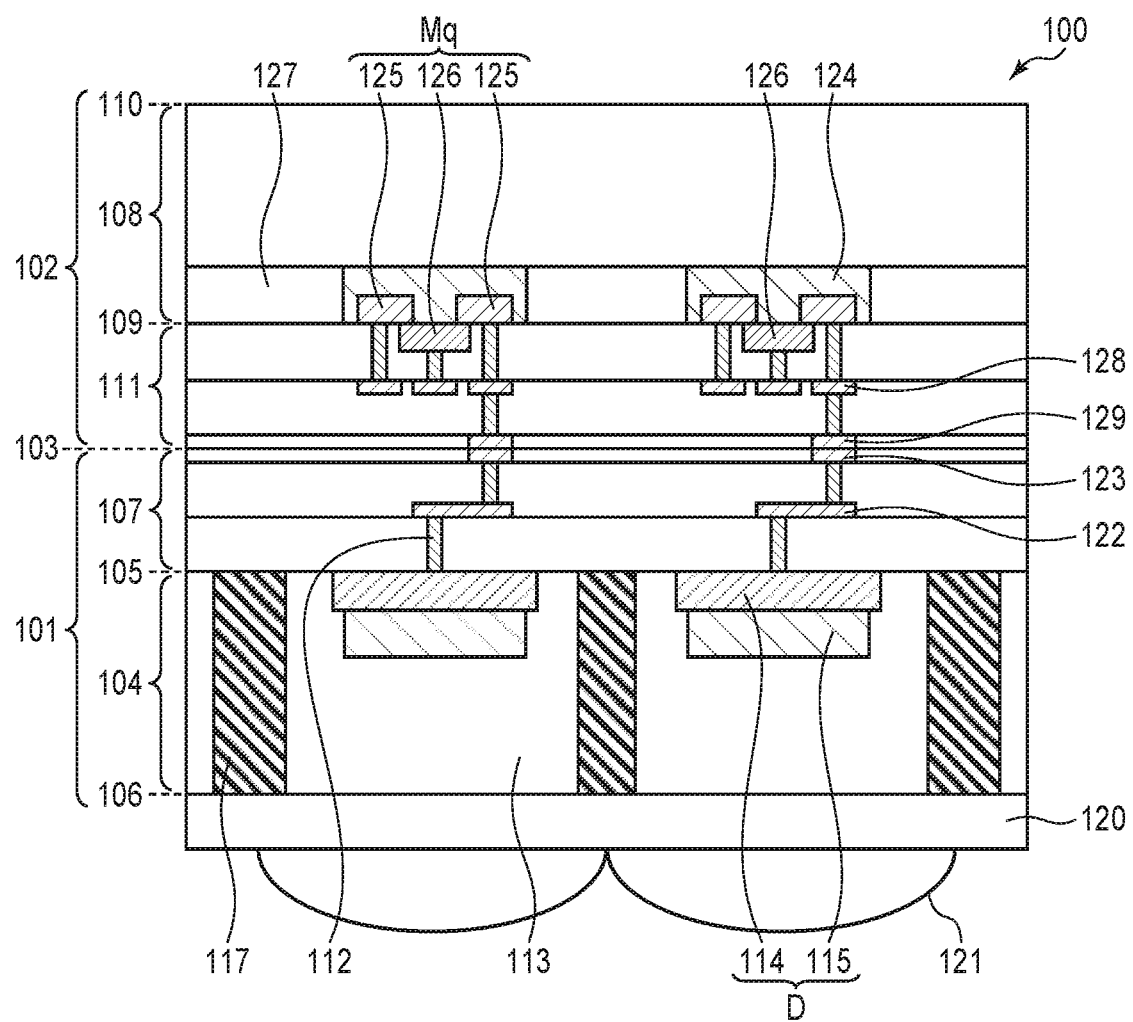
FIG. 5 is a schematic cross-sectional view of the photoelectric conversion device according to the first embodiment of the present invention.

A photoelectric conversion device according to a first embodiment of the present invention will be described with reference to FIG. 1 to FIG. 5. FIG. 1 is a block diagram illustrating a general configuration of a photoelectric conversion device according to the present embodiment. FIG. 2 is a diagram illustrating a general configuration of a pixel of the photoelectric conversion device according to the present embodiment. FIG. 3 is a circuit diagram illustrating a configuration example of the pixel of the photoelectric conversion device according to the present embodiment. FIG. 4 is a timing chart illustrating a method of driving the photoelectric conversion device according to the present embodiment. FIG. 5 is a schematic cross-sectional view of the photoelectric conversion device according to the first embodiment of the present invention.

As illustrated in FIG. 1, a photoelectric conversion device 100 according to the present embodiment includes a pixel region 10, a vertical select circuit 3, signal processing circuits 4, a horizontal select circuit 5, an output circuit 6, and a control circuit 7.

A plurality of pixels P arranged in a matrix over a plurality of rows and a plurality of columns are provided in the pixel region 10. FIG. 1 illustrates 36 pixels P arranged on six rows from the 0th row to the fifth row and six columns from the 0th column to the fifth column together with references indicating the row number and the column number. For example, the pixel P arranged at the first row and the fourth column is labeled with "P14". Note that the number of rows and the number of columns of a pixel array forming the pixel region 10 are not particularly limited.

On each row of the pixel array of the pixel region 10, a control line PVSEL is arranged extending in a first direction (the horizontal direction in FIG. 1). The control line PVSEL is connected to the pixels P aligned in the first direction, respectively, and forms a signal line common to these pixels P. The first direction in which the control line PVSEL extends may be denoted as a row direction or the horizontal direction. Note that the control lines PVSEL are illustrated with references indicating the row number in FIG. 1. For example, the control line on the first row is labeled with a reference "PVSEL[1]".

The control line PVSEL on each row is connected to the vertical select circuit 3. The vertical select circuit 3 is a circuit unit that supplies, to the pixels P via the control line PVSEL, a control signal used for driving a signal generation circuit (not illustrated) within the pixel P.

On each column of the pixel array of the pixel region 10, an output line POUT is arranged extending in a second direction (the vertical direction in FIG. 1) crossing the first direction. The output line POUT is connected to the pixels P aligned in the second direction, respectively, and forms an output line common to these pixels P. The second direction in which the output line POUT extends may be denoted as a column direction or the vertical direction. Note that the output lines POUT are illustrated with references indicating the column number in FIG. 1. For example, the control line on the fourth column is labeled with a reference "POUT4". Each of the output lines POUT includes n signal lines used for outputting an n-bit digital signal.

The output lines POUT are connected to the signal processing circuits 4. Each of the signal processing circuits 4 is provided to the corresponding column of the pixel array of the pixel region 10 and connected to the output line POUT on the corresponding column. The signal processing circuit 4 has a function of holding signals output from the pixels P via the output lines POUT on the corresponding column. Since the signals output from the pixels P correspond to an n-bit signal input via n signal lines of the output lines POUT, each of the signal processing circuits 4 includes at least n holding units used for holding a signal of each bit.

The horizontal select circuit 5 is a circuit unit that supplies, to the signal processing circuits 4, control signals used for reading out signals from the signal processing circuits 4. The horizontal select circuit 5 supplies a control signal to the signal processing circuit 4 on each column via a control line PHSEL. The signal processing circuit 4 that receives the control signal from the horizontal select circuit 5 outputs a signal held in the holding unit to the output circuit 6 via a horizontal output line HSIG. Note that FIG. 1 illustrates the control lines PHSEL together with references indicating the column number. For example, the control line on the fourth column is labeled with a reference "PHSEL[4]". The horizontal output line HSIG includes n signal lines used for outputting an n-bit digital signal.

The output circuit 6 is a circuit unit used for outputting a signal supplied via the horizontal output line HSIG to the outside of the photoelectric conversion device 100 as an output signal SOUT. The control circuit 7 is a circuit unit used for supplying control signals that control the operation of the vertical select circuit 3, the signal processing circuit 4, the horizontal select circuit 5, and the output circuit 6 and the timings thereof. Note that at least some of the control signals that control the operation of the vertical select circuit 3, the signal processing circuit 4, the horizontal select circuit 5, and the output circuit 6 and the timings thereof may be supplied from the outside of the photoelectric conversion device 100.

As illustrated in FIG. 2, each of the pixels P includes a light receiving unit 20 and a signal generation unit 30. The signal generation unit 30 includes a count unit 40 and a signal comparison unit 50. The signal comparison unit 50 includes a signal replacing unit 52. The light receiving unit 20 outputs a pulse in response to incidence of a photon. The count unit 40 generates a count signal indicating a count value of pulses output from the light receiving unit 20. The signal comparison unit 50 compares a count value represented by a count signal output by the count unit 40 with a predetermined threshold value. The signal replacing unit 52 replaces a count signal output by the count unit 40 with a substitute signal indicating a predetermined substitute value in accordance with a result of the comparison performed by the signal comparison unit 50. For example, the signal replacing unit 52 replaces a count signal with a substitute signal when the count value indicated by a count signal is greater than or equal to a threshold value. In this case, the signal generation unit 30 outputs a count signal when the count value indicated by a count signal is less than the threshold value and outputs a substitute signal when the count value indicated by a count signal is greater than or equal to the threshold value. The pixel P outputs one of the count signal and the substitute signal as a pixel signal in accordance with the operation of the signal comparison unit 50.

As illustrated in FIG. 3, the light receiving unit 20 includes an avalanche amplification-type diode D, a quench element Mq formed of a p-channel MOS transistor, and an inverter circuit INV. The signal generation unit 30 includes the count unit 40, the signal comparison unit 50, and switches SW0 and SW1 formed of n-channel MOS transistors. The count unit 40 includes three toggle (T)-flip-flop circuits FF0, FF1, and FF2 forming a three-bit counter circuit. The signal comparison unit 50 includes NOT gates G11, G12, and G13 and NOR gates G14, G15, and G16.

The anode of the diode D is connected to a power source line that supplies a voltage VSS. The cathode of the diode D is connected to the drain of the p-channel MOS transistor forming the quench element Mq. The source of the p-channel MOS transistor forming the quench element Mq is connected to a power source line that supplies a voltage VDD. The input terminal of the inverter circuit INV is connected to a connection node between the diode D and the quench element Mq.

The output terminal of the inverter circuit INV, which is also the output terminal of the light receiving unit 20, is connected to the input terminal of the NOT gate G13, which is also the input terminal of the signal generation unit 30. The output terminal of the NOT gate G13 is connected to one input terminal of the NOR gate G16. The output terminal of the NOR gate G16 is connected to the input terminal T of the T-flip-flop circuit FF0. The output terminal Q of the T-flip-flop circuit FF0 is connected to the input terminal T of the T-flip-flop circuit FF1. The connection node between the output terminal Q of the T-flip-flop circuit FF0 and the input terminal T of the T-flip-flop circuit FF1 is connected to the input terminal of the NOT gate G11. The output terminal of the NOT gate G11 is connected to one input terminal of the NOR gate G14. The output terminal of the NOR gate G14 is connected to the source of the n-channel MOS transistor forming the switch SW0.

The output terminal Q of the T-flip-flop circuit FF1 is connected to the input terminal T of the T-flip-flop circuit FF2. The connection node of output terminal Q of the T-flip-flop circuit FF1 and the input terminal T of the T-flip-flop circuit FF2 is connected to the input terminal of the NOT gate G12. The output terminal of the NOT gate G12 is connected to one input terminal of the NOR gate G15. The output terminal of the NOR gate G15 is connected to the source of the n-channel MOS transistor forming the switch SW1. The output terminal Q of the T-flip-flop circuit FF2 is connected to the other input terminals of the NOR gates G14, G15, and G16, respectively.

The gates of the n-channel MOS transistors forming the switches SW0 and SW1 are connected to the control line PVSEL. The drains of the n-channel MOS transistors forming the switches SW0 and SW1 are connected to the output line POUT. The clear terminals CLR of the T-flip-flop circuits FF0, FF1, and FF2 are connected to the vertical select circuit 3 and are able to be supplied with a control signal PCLR from the vertical select circuit 3.

The diode D is applied with a reverse bias voltage having a magnitude above the breakdown voltage via the quench element Mq from the power source lines that supply voltages VDD and VSS. Thereby, the diode D is set so as to operate in a Geiger mode. Once photons enter the diode D, a large number of electrons (and holes) occur due to an avalanche phenomenon in which electrons excited by incident photons are seeds, and a current flows in the diode D and the quench element Mq. A flow of the current generated by the avalanche phenomenon in the quench element Mq causes a voltage drop by the quench element Mq, and the operation region of the diode D exits the Geiger mode. When the avalanche phenomenon of the diode D stops, the voltage drop by the quench element Mq returns to the original state, the operation region of the diode D again enters a Geiger mode. The inverter circuit INV inverts and amplifies a change in the potential of the cathode of the diode D. With such a configuration, the light receiving unit 20 is able to output the presence or absence of photon incidence as a voltage pulse signal (signal PIXOUT).

The count unit 40 is formed of a three-bit counter circuit in which the T-flip-flop circuits FF0, FF1, and FF2 are connected in series. Thereby, the count unit 40 counts pulses superimposed on the signal PIXOUT supplied from the light receiving unit 20 via the NOT gate G13 and the NOR gate G16. When the output Q of the T-flip-flop circuit FF2 is at a low level, the NOR gate G16 outputs a pulse supplied from the light receiving unit 20 to the T-flip-flop circuit FF0.

When the output Q of the T-flip-flop circuit FF2 is at a low level, the NOR gate G14 outputs the output Q of the T-flip-flop circuit FF0 directly as the 0th bit value of a count value counted by the count unit 40. Further, when the output Q of the T-flip-flop circuit FF2 is at a high level, the NOR gate G14 outputs 0 as the 0th bit value of a count value counted by the count unit 40.

Similarly, when the output Q of the T-flip-flop circuit FF2 is at a low level, the NOR gate G15 outputs the output Q of the T-flip-flop circuit FF1 directly as the first bit value of a count value counted by the count unit 40. Further, when the output Q of the T-flip-flop circuit FF2 is at a high level, the NOR gate G15 outputs 0 as the first bit value of a count value counted by the count unit 40.

That is, the signal comparison unit 50 operates so as to compare a count value, which is the output of the count unit 40, with a predetermined threshold value and, when the count value is greater than or equal to the threshold value, replace the count value with a predetermined substitute value less than a threshold value. More specifically, when the count value of the three-bit counter circuit formed of the T-flip-flop circuits FF0, FF1, and FF2 is 4 or greater, the signal comparison unit 50 replaces a count signal output from the count unit 40 with a substitute signal indicating a substitute value 0 and outputs the substitute value 0.

Note that, while the signal comparison unit 50 is configured such that the threshold value predetermined for the signal comparison unit 50 is 4, the substitute value is 0, and the output value is 0 when the number of photons entering the light receiving unit 20 is greater than or equal to 4 in the configuration example of FIG. 3, the threshold value and the substitute value are not limited thereto. The threshold value may be a value other than 4, and the substitute value may be a value other than 0.

The switches SW0 and SW1 are turned on in response to a control signal supplied from the control line PVSEL and thereby output the count value of the count unit 40 or the substitute value thereto to the output line POUT. The counter circuit formed of the T-flip-flop circuits FF0 to FF2 is configured to reset a counter output signal in response to the control signal PCLR supplied from the vertical select circuit 3.

Next, a method of driving the photoelectric conversion device according to the present embodiment will be described by using FIG. 4. FIG. 4 is a timing chart illustrating the method of driving the photoelectric conversion device according to the present embodiment. FIG. 4 illustrates the control signals PCLR, PVSEL[0], PVSEL[1], and PVSEL[5] supplied from the vertical select circuit 3, control signals PHSEL[0], PHSEL[1], and PHSEL[5] supplied from the horizontal select circuit 5, and the output signal SOUT.

At time t1, the vertical select circuit 3 controls the control signal PCLR from a high level to a low level. Thereby, the T-flip-flop circuits FF0, FF1, and FF2 of the count units 40 of all the pixels P are reset. That is, the value of the count value indicated by the count unit 40 is 0.

Next, in a period from the time when the control signal PCLR is turned to the high level to time t2, the light receiving unit 20 of each pixel P outputs a signal PIXOUT including pulses in which the number of the pulses corresponds to the number of incident photons. The count unit 40 of the signal generation unit 30 of each pixel P then counts the number of pulses superimposed on the signal PIXOUT output from the light receiving unit 20.

Next, at time t2, the vertical select circuit 3 controls the control signal PVSEL[0] from the low level to the high level and turns on the switches SW0 and SW1 of the pixels P belonging to the 0th row. Thereby, a signal indicating the count value output from the count unit 40 of the pixels P belonging to the 0th row or the substitute value output from the signal comparison unit 50 is output to the signal processing circuit 4 on the corresponding column via the output line POUT on the corresponding column. The signal processing circuit 4 on each column holds a signal output from the pixels P on the corresponding column.

Next, in a period from time t3 after the control signal PVSEL[0] is controlled to the low level to time t4, the horizontal select circuit 5 sequentially controls the control signal PHSEL[0], PHSEL[1], . . . , PHSEL[5] corresponding to the signal processing circuit 4 on each column to the high level. Thereby, signals (data D00 to D05) held in the signal processing circuit 4 on each column are sequentially output as the output signal SOUT to the outside of the photoelectric conversion device 100 via the horizontal output line HSIG and the output circuit 6. Note that the data D00 to D05 of the output signal SOUT correspond to the output of the pixels P00 to P05 in FIG. 1.

Subsequently, in a similar manner to the operation in the period from time t2 to time t4, signals from the pixels P belonging to the first row to the fifth row are sequentially read out on a row basis. For example, in a period from time t4 to time t6, signals read out from the pixels P on each column on the first row (data D10 to D15) are sequentially output as the output signal SOUT. Further, in a period from time t6 to time t8, signals read out from the pixels P on each column on the fifth row (data D50 to D55) are sequentially output as the output signal SOUT.

In such a way, the photoelectric conversion device 100 according to the present embodiment includes the signal comparison unit 50 that compares a count value indicated by a count signal output from the count unit 40 with a predetermined threshold value. Therefore, when an anomaly of an output value due to a pixel defection or the like of the pixel P arranged in the pixel region 10 occurs and the output value of the count unit 40 exceeds an expected value, it is possible to detect the anomaly on a pixel P basis. Further, the photoelectric conversion device 100 according to the present embodiment includes the signal replacing unit 52 that, when the count value indicated by a count signal output from the count unit 40 is greater than or equal to a predetermined threshold value, replaces the count signal output by the count unit 40 with a substitute signal indicating a predetermined substitute value. Therefore, when there is an anomaly in an output value of the pixel P due to a pixel defection or the like, it is possible to correct the output value.

Next, a specific configuration example of the photoelectric conversion device 100 according to the present embodiment will be described by using FIG. 5. FIG. 5 is a schematic cross-sectional view illustrating the structure of the photoelectric conversion device according to the present embodiment. FIG. 5 illustrates the cross-sectional structure of two pixels P arranged adjacently.

The photoelectric conversion device 100 includes a first chip 101 and a second chip 102. The first chip 101 and the second chip 102 are joined at a junction interface 103. The diode D out of the components of the pixel P is arranged in the first chip 101. Out of the components of the pixel P, the remaining components other than the diode D of the pixel P, that is, the quench element Mq, the inverter circuit INV, and the signal generation unit 30 are arranged in the second chip 102. FIG. 5 illustrates only the diode D and the quench element Mq out of the above components of the pixel P.

The first chip 101 includes a first substrate 104. The first substrate 104 has a primary face 105 that is a face on the junction interface 103 side and a backside face 106 that is a face opposite thereto. Inside the first substrate 104, wells 113 and element isolation regions 117 isolating the wells 113 are provided. The diode D formed of p-n junction of an n-type region 114 in contact with the primary face 105 and a p-type region 115 in contact with the bottom of the n-type region 114 is provided on the primary face 105 side inside the well 113. A multilevel interconnection structure 107 including the interconnection layer 122 and the interconnection layer 123 is provided on the primary face 105 of the first substrate 104. Electrical connection by a contact plug 112 made of a tungsten, for example, is provided between the diode D and the interconnection layer 122 and between the interconnection layer 122 and the interconnection layer 123. A color filter layer 120 including a planarization layer or the like and a micro lens 121 are provided over the backside face 106 of the first substrate 104.

The second chip 102 includes a second substrate 108. The second substrate 108 has a primary face 109 that is a face on the junction interface 103 side and a backside face 110 that is a face opposite thereto. On the primary face 109 side inside the second substrate 108, wells 124 and element isolation regions 127 isolating the wells 124 are provided. The p-channel MOS transistor forming the quench element Mq including the source/drain region 125 and the gate electrode 126 is provided in the well 124. A multilevel interconnection structure 111 including the interconnection layer 128 and the interconnection layer 129 is provided on the primary face 109 of the second substrate 108. Electrical connection by a contact plug 112 made of a tungsten, for example, is provided between each terminal of the quench element Mq and the interconnection layer 128 and between the interconnection layer 128 and the interconnection layer 129.

The first chip 101 and the second chip 102 are attached to each other such that the interconnection layer 123 in the uppermost layer of the first chip 101 and the interconnection layer 129 in the uppermost layer of the second chip 102 are electrically connected to each other at the junction interface 103.

In such a way, the photoelectric conversion device 100 according to the present embodiment can be configured as a backside irradiation type photoelectric conversion device that guides a light received from the backside face 106 side of the first substrate 104 to the diode D via the micro lens 121 and the color filter layer 120. However, the photoelectric conversion device 100 of the present embodiment is not necessarily required to be a backside irradiation type photoelectric conversion device and may be a front face irradiation type photoelectric conversion device.

As discussed above, according to the present embodiment, in a photon-count type photoelectric conversion device, detection of a defective pixel or correction of an output value from a defective pixel can be performed.

Second Embodiment

Figure 6:
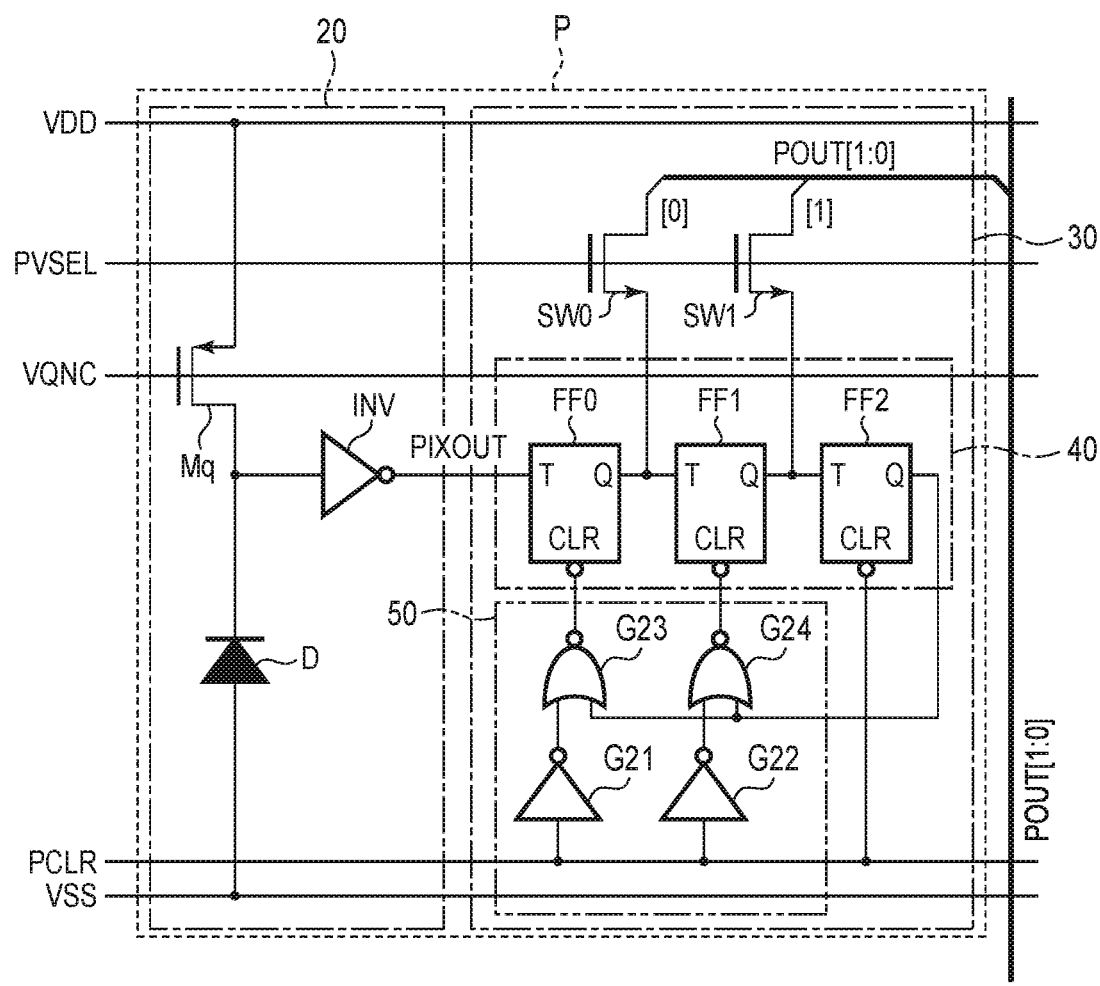
FIG. 6 is a circuit diagram illustrating a configuration example of a pixel of a photoelectric conversion device according to a second embodiment of the present invention.

A photoelectric conversion device according to a second embodiment of the present invention will be described with reference to FIG. 6. Components similar to those in the photoelectric conversion device according to the first embodiment are labeled with the same references, and the description thereof will be omitted or simplified. FIG. 6 is a circuit diagram illustrating a configuration example of the second pixel of the photoelectric conversion device according to the present embodiment.

In the present embodiment, another configuration example of the pixel P will be described. Other elements are the same as those in the photoelectric conversion device according to the first embodiment.

Figure 9:
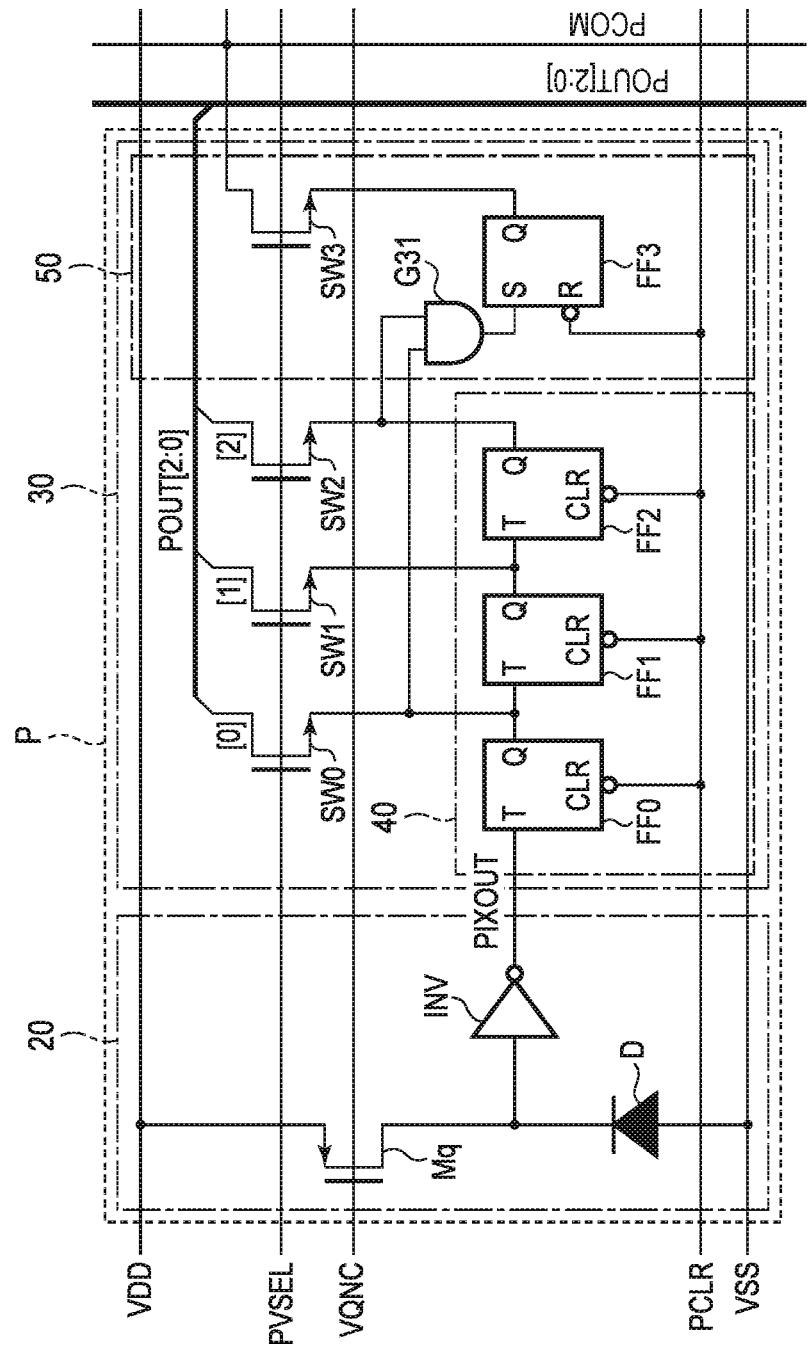
FIG. 9 is a circuit diagram illustrating a configuration example of the pixel of the photoelectric conversion device according to the third embodiment of the present invention.

As illustrated in FIG. 6, the pixel P of the photoelectric conversion device according to the present embodiment includes the light receiving unit 20 and the signal generation unit 30 in the same manner as the first embodiment. The light receiving unit 20 is the same as that of the photoelectric conversion device according to the first embodiment illustrated in FIG. 3. As illustrated in FIG. 9, the signal generation unit 30 includes the count unit 40, the signal comparison unit 50, and the switches SW0 and SW1 formed of the n-channel MOS transistors. The count unit 40 includes three T-flip-flop circuits FF0, FF1, and FF2 forming a three-bit counter circuit. The signal comparison unit 50 includes NOT gates G21 and G22 and NOR gates G23 and G24.

The output terminal of the inverter circuit INV, which is also the output terminal of the light receiving unit 20, is connected to the input terminal T of the T-flip-flop circuit FF0, which is also the input terminal of the signal generation unit 30. The output terminal Q of the T-flip-flop circuit FF0 is connected to the input terminal T of the T-flip-flop circuit FF1. The connection node between the output terminal Q of the T-flip-flop circuit FF0 and the input terminal T of the T-flip-flop circuit FF1 is connected to the source of the n-channel MOS transistor forming the switch SW0. The output terminal Q of the T-flip-flop circuit FF1 is connected to the input terminal T of the T-flip-flop circuit FF2. The connection node between the output terminal Q of the T-flip-flop circuit FF1 and the input terminal T of the T-flip-flop circuit FF2 is connected to the source of the re-channel MOS transistor forming the switch SW1. The output terminal Q of the T-flip-flop circuit FF2 is connected to one input terminals of the NOR gates G23 and G24, respectively.

The gates of the n-channel MOS transistors forming the switches SW0 and SW1 are connected to the control line PVSEL. The drains of the n-channel MOS transistors forming the switches SW0 and SW1 are connected to the output line POUT.

The output terminal of the NOT gate G21 is connected to the other input terminal of the NOR gate G23. The output terminal of the NOR gate G23 is connected to the clear terminal CLR of the T-flip-flop circuit FF0. Further, the output terminal of the NOT gate G22 is connected to the other input terminal of the NOR gate G24. The output terminal of the NOR gate G24 is connected to the clear terminal CLR of the T-flip-flop circuit FF1. The input terminals of the NOT gates G21 and G22 and the clear terminal CLR of the T-flip-flop circuit FF2 are connected to the vertical select circuit 3 to be able to be supplied the control signal PCLR from the vertical select circuit 3.

The count unit 40 is formed of a three-bit counter circuit in which the T-flip-flop circuits FF0, FF1, and FF2 are connected in series. Thereby, the count unit 40 counts pulses superimposed on the signal PIXOUT supplied from the light receiving unit 20. The switches SW0 and SW1 are turned on in response to a control signal supplied from the control line PVSEL and thereby output the values of the least significant two bits of the counter circuit formed of the T-flip-flop circuits FF0 to FF2 to the output line POUT as an output signal.

The signal comparison unit 50 is configured to reset the T-flip-flop circuits FF0 and FF1 in accordance with the control signal PCLR and the output of the T-flip-flop circuit FF2. Specifically, when the control signal PCLR is at the low level or the control signal PCLR and the output of the T-flip-flop circuit FF2 are at the high level, the signal comparison unit 50 resets the T-flip-flop circuits FF0 and FF1. That is, as with the first embodiment, when the count value of the counter circuit formed of the T-flip-flop circuits FF0, FF1, and FF2 is 4 or greater, the signal comparison unit 50 replaces a count signal output from the count unit 40 with a substitute signal indicating a substitute value 0 and outputs the substitute value 0.

Note that, while the signal comparison unit 50 is configured such that the threshold value predetermined for the signal comparison unit 50 is 4, the substitute value is 0, and the output value is 0 when the number of photons entering the light receiving unit 20 is greater than or equal to 4 in the configuration example of FIG. 6, the threshold value and the substitute value are not limited thereto. The threshold value may be a value other than 4, and the substitute value may be a value other than 0.

In such a way, the photoelectric conversion device 100 according to the present embodiment includes the signal comparison unit 50 that compares a count value indicated by a count signal output from the count unit 40 with a predetermined threshold value. Therefore, when an anomaly of an output value due to a pixel defection or the like of the pixel P arranged in the pixel region 10 occurs and the output value of the count unit 40 exceeds an expected value, it is possible to detect the anomaly on a pixel P basis. Further, the photoelectric conversion device 100 according to the present embodiment includes the signal replacing unit 52 that, when the count value indicated by a count signal output from the count unit 40 is greater than or equal to a predetermined threshold value, replaces the count signal output by the count unit 40 with a substitute signal indicating a predetermined substitute value. Therefore, when there is an anomaly in an output value of the pixel P due to a pixel defection or the like, it is possible to correct the output value.

As discussed above, according to the present embodiment, in a photon-count type photoelectric conversion device, detection of a defective pixel or correction of an output value from a defective pixel can be performed.

Third Embodiment

A photoelectric conversion device according to a third embodiment of the present invention will be described with reference to FIG. 7 to FIG. 9. Components similar to those in the photoelectric conversion device according to the first and second embodiments are labeled with the same references, and the description thereof will be omitted or simplified.

Figure 7:
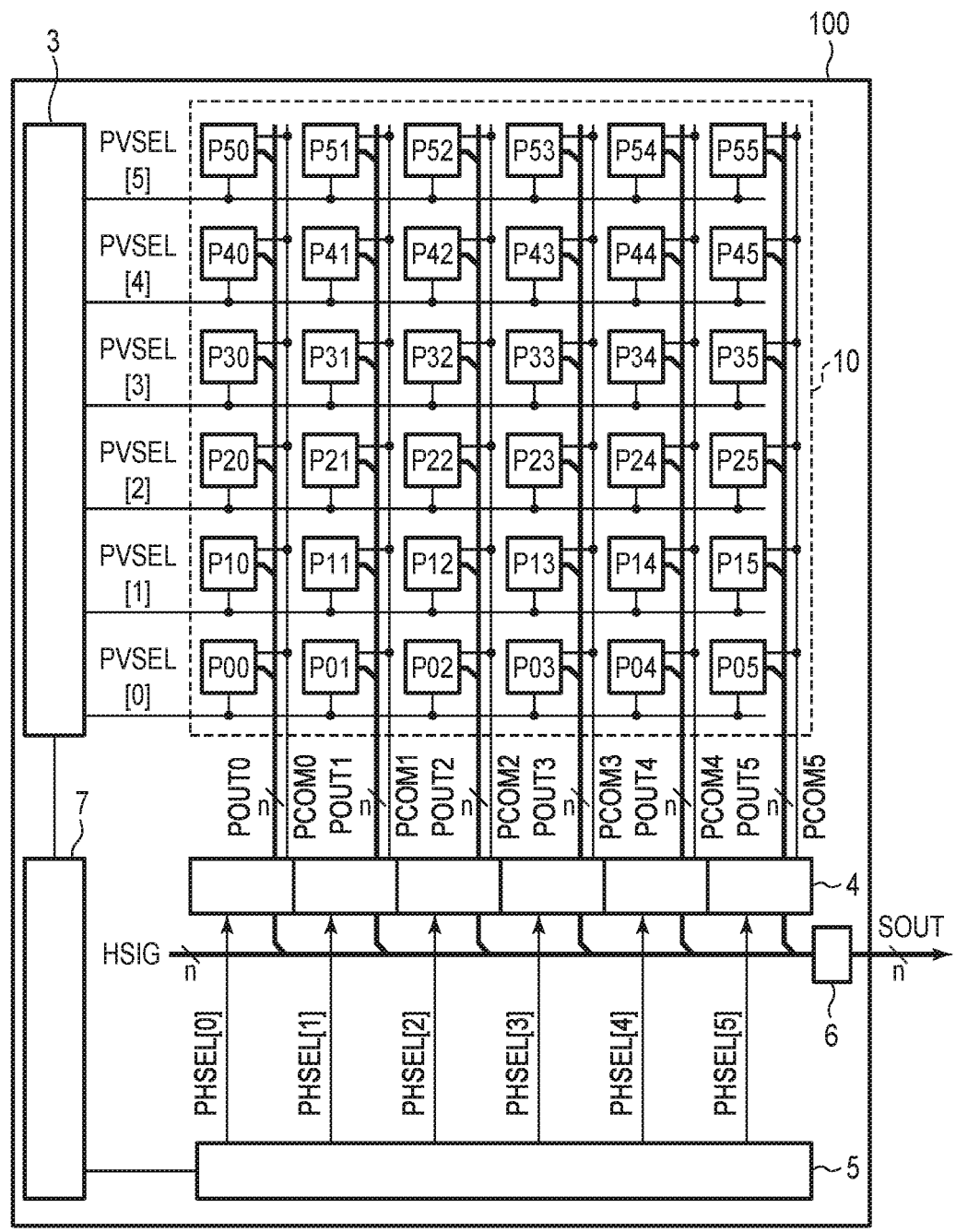
FIG. 7 is a block diagram illustrating a general configuration of a photoelectric conversion device according to a third embodiment of the present invention.

FIG. 7 is a block diagram illustrating a general configuration of the photoelectric conversion device according to the present embodiment. FIG. 8 is a conceptual diagram illustrating a configuration of the pixel P in the photoelectric conversion device 100 according to the present embodiment. FIG. 9 is a circuit diagram illustrating a configuration example of the pixel of the photoelectric conversion device according to the present embodiment.

As illustrated in FIG. 7, the photoelectric conversion device 100 according to the present embodiment is the same as the photoelectric conversion device according to the first embodiment illustrated in FIG. 1 except that a plurality of signal lines PCOM arranged extending in the second direction are further provided on respective columns of the pixel array of the pixel region 10. The signal line PCOM on each column is connected to the pixels P aligned in the second direction, respectively, and forms a signal line common to these pixels P. Note that the signal lines PCOM are illustrated with references indicating the column number in FIG. 7. For example, the signal line on the fourth column is labeled with a reference "PCOM4".

The output line POUT and the signal line PCOM on each column are connected to the signal processing circuit 4 on the corresponding column. The signal processing circuit 4 has a function of holding signals output from the pixels P via the output line POUT. Further, the signal processing circuit 4 has a function of writing a predetermined value to the holding unit or rewriting a value to a predetermined value in the holding unit in accordance with the level of a signal output from the signal line PCOM. Note that, in other words, that the signal line PCOM may correspond to some of the plurality of signal lines forming the output line POUT.

Figure 8:
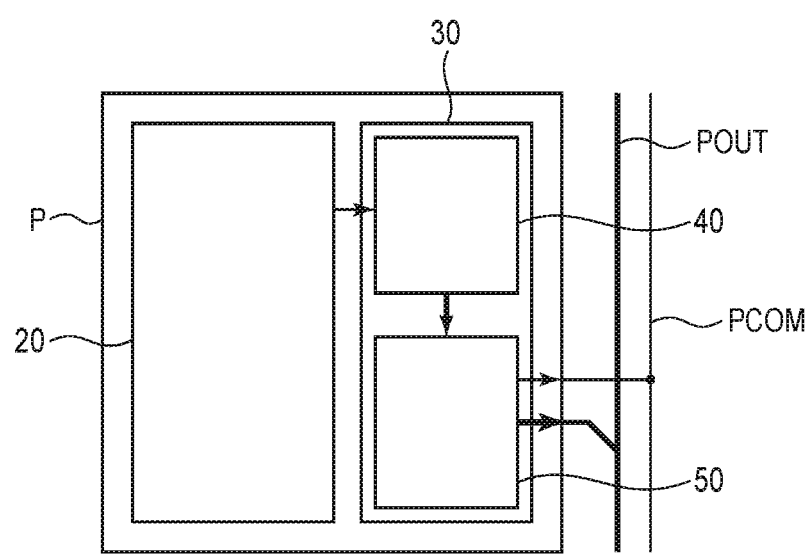
FIG. 8 is a diagram illustrating a general configuration of a pixel of a photoelectric conversion device according to a third embodiment of the present invention.

As illustrated in FIG. 8, each of the pixels P includes the light receiving unit 20 and the signal generation unit 30. The signal generation unit 30 includes the count unit 40 and the signal comparison unit 50. The light receiving unit 20 outputs a pulse indicating the presence or absence of photon incidence in response to incidence of a light. The count unit 40 generates a count signal indicating a count value of pulses output from the light receiving unit 20. The signal comparison unit 50 compares a count value represented by a count signal output by the count unit 40 with a predetermined threshold value and outputs a determination signal indicating a result of the comparison to the signal line PCOM. Further, the signal comparison unit 50 outputs a count signal output by the count unit 40 to the output line POUT.

As illustrated in FIG. 9, the pixel P of the photoelectric conversion device according to the present embodiment includes the light receiving unit 20 and the signal generation unit 30. The light receiving unit 20 is the same as that of the photoelectric conversion device according to the first embodiment illustrated in FIG. 3. The signal generation unit 30 includes the count unit 40, the signal comparison unit 50, and switches SW0, SW1, and SW2 formed of n-channel MOS transistors. The count unit 40 includes three T-flip-flop circuits FF0, FF1, and FF2 forming a three-bit counter circuit. The signal comparison unit 50 includes an AND gate G31, a set-reset (SR)-flip-flop circuit FF3, and a switch SW3 formed of an n-channel MOS transistor.

The output terminal of the inverter circuit INV, which is also the output terminal of the light receiving unit 20, is connected to the input terminal T of the T-flip-flop circuit FF0, which is also the input terminal of the signal generation unit 30. The output terminal Q of the T-flip-flop circuit FF0 is connected to the input terminal T of the T-flip-flop circuit FF1. The connection node between the output terminal Q of the T-flip-flop circuit FF0 and the input terminal T of the T-flip-flop circuit FF1 is connected to the source of the n-channel MOS transistor forming the switch SW0 and one input terminal of the AND gate G31. The output terminal Q of the T-flip-flop circuit FF1 is connected to the input terminal T of the T-flip-flop circuit FF2. The connection node between the output terminal Q of the T-flip-flop circuit FF1 and the input terminal T of the T-flip-flop circuit FF2 is connected to the source of the n-channel MOS transistor forming the switch SW1. The output terminal Q of the T-flip-flop circuit FF2 is connected to the source of the n-channel MOS transistor forming the switch SW2 and the other input terminal of the AND gate G31.

The output terminal of the AND gate G31 is connected to the input terminal S of the SR-flip-flop circuit FF3. The output terminal Q of the SR-flip-flop circuit FF3 is connected to the source of the n-channel MOS transistor forming the switch SW3.

The gates of the n-channel MOS transistors forming the switches SW0, SW1, SW2, and SW3 are connected to the control line PVSEL. The drains of the n-channel MOS transistors forming the switches SW0, SW1, and SW2 are connected to the output line POUT. The drain of the n-channel MOS transistors forming the switches SW3 is connected to the signal line PCOM. The clear terminals CLR of the T-flip-flop circuits FF0, FF1, and FF2 and the input terminal R of the SR-flip-flop circuit FF3 are connected to the vertical select circuit 3 to be able to be supplied with the control signal PCLR from the vertical select circuit 3.

The AND gate G31 outputs a high-level signal when both the output of the T-flip-flop circuit FF0 indicating the value of the 0th bit (LSB) and the output of the T-flip-flop circuit FF2 indicating the value of the second bit (MSB) are at the high level. Thereby, the SR-flip-flop circuit FF3 transitions to a set state, the output thereof becomes the high level, and a high-level signal is output to the signal line PCOM when the switch SW3 is in an on-state. That is, the signal comparison unit 50 is configured to output a high-level determination signal to the signal line PCOM when the output value of the count unit 40 becomes 5 or greater.

With such a configuration of the pixel P, when the signal processing circuit 4 receives a high-level determination signal via the signal line PCOM, it can be determined that an anomaly due to a pixel defection or the like occurs in the pixel signal output from the output line POUT. When it is determined that an anomaly occurs in the pixel signal output from the output line POUT, it is possible to perform correction on the output value of the pixel signal such as to replace it to a predetermined substitute value in the signal processing circuit 4.

Note that, while the threshold value predetermined for the signal comparison unit 50 is 5 in the configuration example of FIG. 9, the threshold value is not limited thereto. The threshold value may be a value other than 5 and may be changed as appropriate.

As discussed above, according to the present embodiment, in a photon-count type photoelectric conversion device, detection of a defective pixel or correction of an output value from a defective pixel can be performed.

Fourth Embodiment

Figure 10:
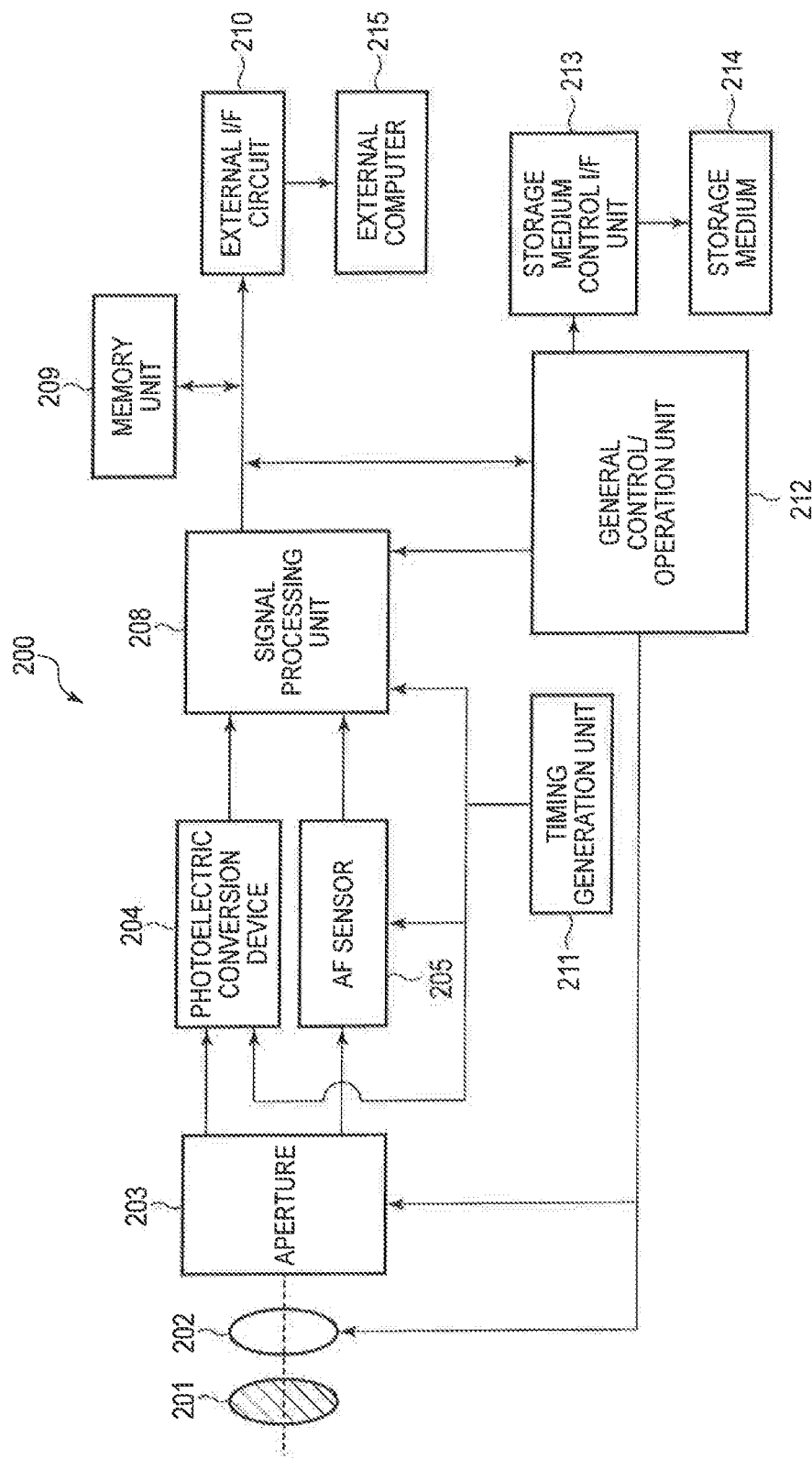
FIG. 10 is a block diagram illustrating a general configuration of a photoelectric conversion system according to a fourth embodiment of the present invention.

A photoelectric conversion system according to a fourth embodiment of the present invention will be described with reference to FIG. 10. FIG. 10 is a block diagram illustrating a configuration example of the photoelectric conversion system according to the present embodiment.

As illustrated in FIG. 10, a photoelectric conversion system 200 according to the present embodiment includes a barrier 201, a lens 202, an aperture 203, a photoelectric conversion device 204, and an AF sensor 205. The lens 202 is an optical system used for capturing an optical image of an object. The barrier 201 protects the lens 202. The aperture 203 is for adjusting a light amount of a light passing through the lens 202. The photoelectric conversion device 204 is formed by using the photoelectric conversion device 100 described in the first to third embodiments, which is for acquiring an optical image of an object captured by the lens 202 as an image signal. The AF sensor 205 is for acquiring a signal necessary for focus detection.

Further, the photoelectric conversion system 200 further includes a signal processing unit 208. The signal processing unit 208 is for performing a process of a signal output from the photoelectric conversion device 204 or the AF sensor 205 or a process to perform various correction on the acquired image data or a process to compress data.

Further, the photoelectric conversion system 200 further includes a memory unit 209, an external I/F circuit 210, a timing generation unit 211, a general control/operation unit 212, and a storage medium control I/F unit 213. The memory unit 209 is for temporarily store image data. The external I/F circuit 210 is for communicating with an external device such as an external computer 215. The timing generation unit 211 is for outputting various timing signals to the signal processing unit 208 or the like. The general control/operation unit 212 is for controlling various calculation and the entire camera. The storage medium control I/F unit 213 is for communicating data with a removable storage medium 214 such as a semiconductor memory used for storing acquired image data or reading out image data.

When the barrier 201 is opened, an optical image from the object enters the AF sensor 205 via the lens 202 and the aperture 203. The general control/operation unit 212 calculates a distance to the object by using the phase difference detection scheme described above based on an output signal from the AF sensor 205. The general control/operation unit 212 then drives the lens 202 based on the calculation result, again determines whether or not focusing is obtained on the capturing surface, and when determining that focusing is not obtained, performs autofocus control to drive the lens 202 again.

Next, after focusing is confirmed, a charge accumulation operation by the photoelectric conversion device 204 is started. Upon the completion of the charge accumulation operation of the photoelectric conversion device 204, an image signal output from the photoelectric conversion device 204 is written to the memory unit 209 by the general control/operation unit 212 via the signal processing unit 208.

The data accumulated in the memory unit 209 is then stored in the storage medium 214 via the storage medium control I/F unit 213 by the control of the general control/operation unit 212. Alternatively, data accumulated in the memory unit 209 may be directly input to the external computer 215 or the like via the external I/F circuit 210.

As described in the first to third embodiments, a use of the photoelectric conversion device 100 illustrated in the above embodiments enables detection of a defection or the like and correction of an output value for each of the pixels P. Therefore, according to the photoelectric conversion system of the present embodiment using the photoelectric conversion device 204, a higher quality image can be acquired.

Fifth Embodiment

Figure 11A:
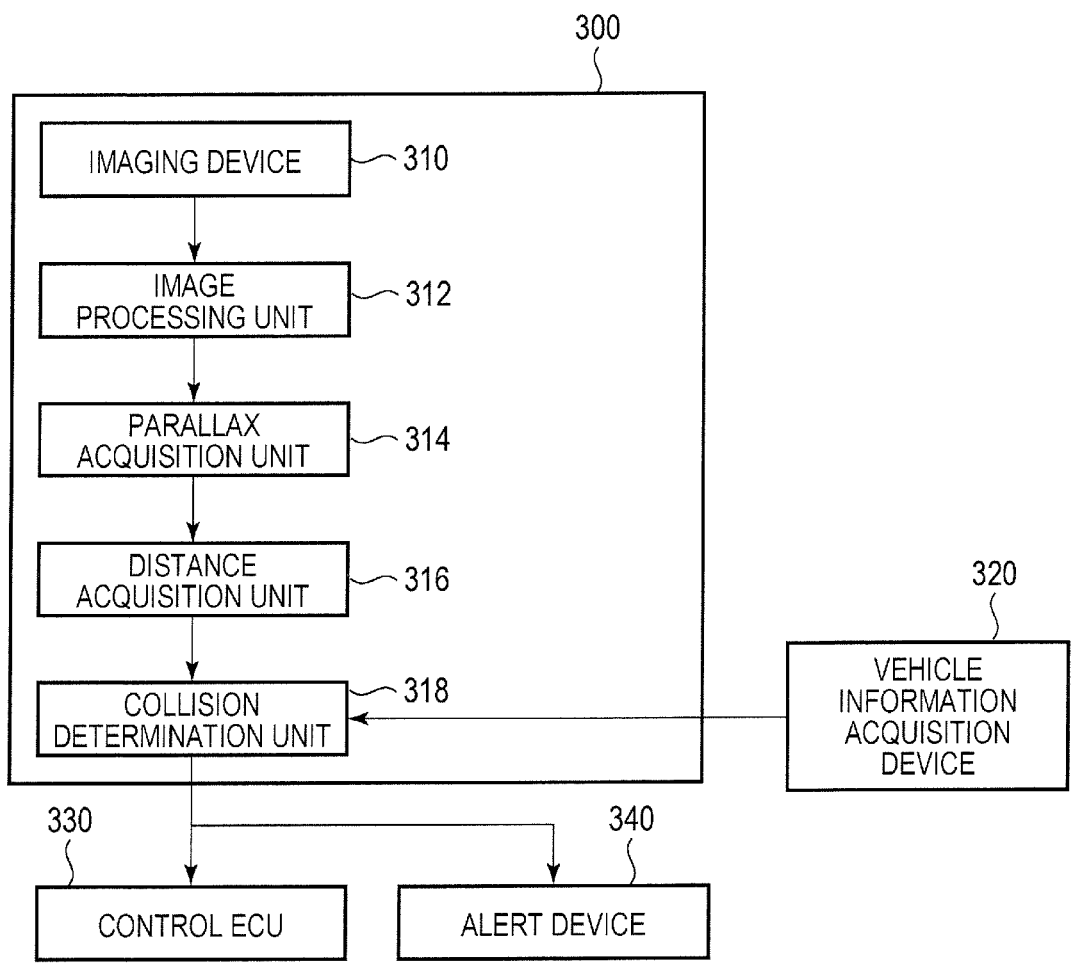
FIG. 11A is a diagram illustrating a configuration example of a photoelectric conversion system according to a fifth embodiment of the present invention.
Figure 11B:
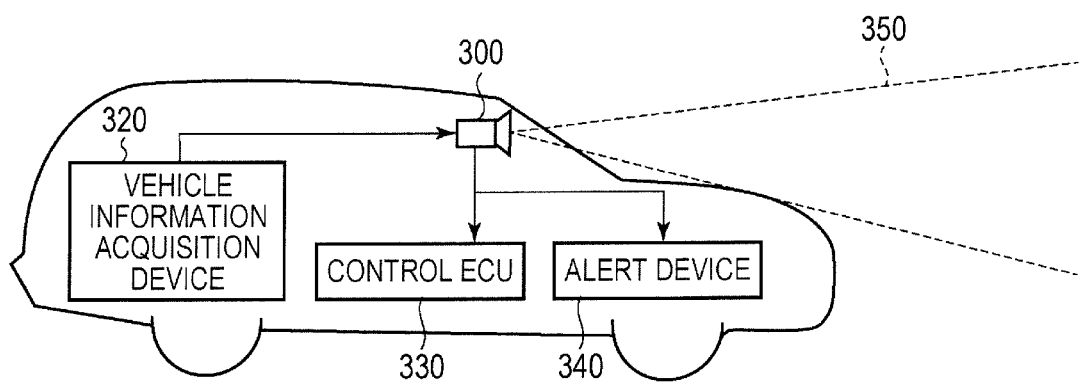
FIG. 11B is a diagram illustrating a configuration example of a movable object according to the fifth embodiment of the present invention.

A photoelectric conversion system and a movable object according to a fifth embodiment of the present invention will be described with reference to FIG. 11A and FIG. 11B. FIG. 11A is a diagram illustrating the configuration of the photoelectric conversion system according to the present embodiment. FIG. 11B is a diagram illustrating the configuration of the movable object according to the present embodiment.

FIG. 11A illustrates an example of an photoelectric conversion system related to an on-vehicle camera. A photoelectric conversion system 300 includes an imaging device 310. The imaging device 310 is any of the photoelectric conversion devices 100 described in any of the above first to third embodiments. The photoelectric conversion system 300 includes an image processing unit 312 that performs image processing on a plurality of image data acquired by the imaging device 310 and a parallax acquisition unit 314 that calculates a parallax from the plurality of image data acquired by the photoelectric conversion system 300 (a phase difference between parallax images). Further, the photoelectric conversion system 300 includes a distance acquisition unit 316 that calculates a distance to an object based on the calculated parallax and a collision determination unit 318 that determines whether or not there is a collision possibility based on the calculated distance. Here, the parallax acquisition unit 314 or the distance acquisition unit 316 is an example of a distance information acquisition unit that acquires distance information on the distance to an object. That is, the distance information is information on a parallax, a defocus amount, a distance to an object, or the like. The collision determination unit 318 may use any of the distance information to determine the collision possibility. The distance information acquisition unit may be implemented by dedicatedly designated hardware or may be implemented by a software module. Further, the distance information acquisition unit may be implemented by a Field Programmable Gate Array (FPGA), an Application Specific Integrated Circuit (ASIC), or the like or may be implemented by a combination thereof.

The photoelectric conversion system 300 is connected to a vehicle information acquisition device 320 and can acquire vehicle information such as a vehicle speed, a yaw rate, a steering angle, or the like. Further, the photoelectric conversion system 300 is connected to a control ECU 330, which is a control device that outputs a control signal for causing a vehicle to generate braking force based on a determination result by the collision determination unit 318. Further, the photoelectric conversion system 300 is also connected to an alert device 340 that issues an alert to the driver based on a determination result by the collision determination unit 318. For example, when the collision probability is high as the determination result of the collision determination unit 318, the control ECU 330 performs vehicle control to avoid a collision or reduce damage by applying a brake, pushing back an accelerator, suppressing engine power, or the like. The alert device 340 alerts a user by sounding an alert such as a sound, displaying alert information on a display of a car navigation system or the like, providing vibration to a seat belt or a steering wheel, or the like.

In the present embodiment, an area around a vehicle, for example, a front area or a rear area is captured by using the photoelectric conversion system 300. FIG. 11B illustrates the photoelectric conversion system in a case of capturing a front area of a vehicle (a capturing region 350). The vehicle information acquisition device 320 transmits instructions to the photoelectric conversion system 300 or the imaging device 310. With such a configuration, accuracy of ranging can be improved.

Although an example of control for avoiding a collision to another vehicle has been described in the description above, it is applicable to automatic driving control for following another vehicle, automatic driving control for not going out of a traffic lane, or the like. Furthermore, the photoelectric conversion system is not limited to a vehicle such as the subject vehicle and can be applied to a movable object (transport apparatus) such as a ship, an airplane, or an industrial robot, for example. In addition, the photoelectric conversion system can be widely applied to a device which utilizes object recognition, such as an intelligent transportation system (ITS), without being limited to movable objects.

Modified Embodiments

The present invention is not limited to the embodiments described above, and various modifications are possible.

For example, an example in which a part of the configuration of any of the embodiments is added to another embodiment or an example in which a part of the configuration of any of the embodiments is replaced with a part of the configuration of another embodiment is one of the embodiments of the present invention.

Further, in the photoelectric conversion device 100 of the first to third embodiments, the pixel circuit forming the pixel P is not limited to those illustrated. For example, the counter circuit forming the count unit 40 is not limited to the illustrated configuration corresponding to the number of counter bits.

Further, while the examples in which the signal replacing unit 52 substitutes an output value of a pixel with 0 in accordance with a threshold value set for the signal comparison unit 50 has been described in the first and second embodiments, a threshold value or a substitute value set for the signal comparison unit 50, a circuit configuration of the signal comparison unit 50, or the like is not particularly limited. Further, while an example in which a determination signal in accordance with a threshold value set for the signal comparison unit 50 is output to the signal processing circuit 4 has been described in the third embodiment, a threshold value set for the signal comparison unit 50, a signal level of the determination signal, a circuit configuration of the signal comparison unit 50, or the like is not particularly limited. The value of the threshold value can be determined based on a determination criterion for a defective pixel.

Further, the photoelectric conversion systems illustrated in the above fourth and fifth embodiments are examples of a photoelectric conversion system to which the photoelectric conversion device of the present invention may be applied, and a photoelectric conversion system to which the photoelectric conversion device of the present invention can be applied is not limited to the configuration illustrated in FIG. 10 and FIG. 11A.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-070867, filed Apr. 2, 2018 which is hereby incorporated by reference herein in its entirety.

What is claimed is:

1. A photoelectric conversion device comprising:
   a plurality of pixels arranged in a plurality of rows and a plurality of columns; and
   a plurality of output lines to which signals from the plurality of pixels are output,
   wherein each of the plurality of pixels includes a light receiving unit that outputs a pulse in response to incidence of a photon and a signal generation unit that, based on output from the light receiving unit, generates a pixel signal output to corresponding output line,
   wherein the signal generation unit includes a count unit that generates a count signal indicating a count value of pulses output from the light receiving unit and a comparison unit that compares the count value indicated by the count signal with a predetermined threshold value, and
   wherein the signal generation unit outputs a signal in accordance with a result of comparison performed by the comparison unit.

2. The photoelectric conversion device according to claim 1, wherein the signal generation unit outputs one of the pixel signal indicating the count value and the pixel signal indicating a predetermined substitute value in accordance with the result of the comparison.

3. The photoelectric conversion device according to claim 2, wherein the signal generation unit outputs the pixel signal indicating the count value when the count value is less than the threshold value and outputs the pixel signal indicating the substitute value when the count value is not less than the threshold value.

4. The photoelectric conversion device according to claim 3, wherein when the count value is not less than the threshold value, the signal generation unit sets a count value indicated by a count signal output by the reset count unit to the substitute value.

5. The photoelectric conversion device according to claim 1 further comprising a signal processing circuit connected to the output line,
   wherein the signal generation unit outputs, to the signal processing circuit, the pixel signal indicating the count value and a determination signal indicating the result of the comparison performed by the comparison unit, and
   wherein the signal processing circuit replaces the count value with a predetermined substitute value in accordance with the determination signal.

6. The photoelectric conversion device according to claim 5, wherein the signal processing circuit replaces the count value with the substitute value when the determination signal indicates that the count value is not less than the threshold value.

7. The photoelectric conversion device according to claim 1, wherein the threshold value is defined based on a determination criterion of a defective pixel.

8. A photoelectric conversion system comprising:
   the photoelectric conversion device according to claim 1; and
   a signal processing unit that processes a signal output from the photoelectric conversion device.

9. A movable object comprising:
   the photoelectric conversion device according to claim 1;
   a distance information acquisition unit that acquires distance information on a distance to an object, from a parallax image based on signals from the photoelectric conversion device; and
   a control unit that controls the movable object based on the distance information.

* * * * *